United States Patent

Duane et al.

[11] Patent Number: 5,963,809
[45] Date of Patent: Oct. 5, 1999

[54] ASYMMETRICAL MOSFET WITH GATE PATTERN AFTER SOURCE/DRAIN FORMATION

[75] Inventors: Michael Duane, Austin; Mark I. Gardner, Cedar Creek, both of Tex.

[73] Assignee: Advanced Micro Devices, Inc., Sunnyvale, Calif.

[21] Appl. No.: 08/883,511

[22] Filed: Jun. 26, 1997

[51] Int. Cl.$^6$ .................. H01L 21/336; H01L 21/266
[52] U.S. Cl. ............................................ 438/286
[58] Field of Search ................................. 438/286

[56] References Cited

U.S. PATENT DOCUMENTS

| | | |
|---|---|---|
| 4,272,881 | 6/1981 | Angle . |
| 4,621,277 | 11/1986 | Ito et al. . |
| 4,855,247 | 8/1989 | Ma et al. . |
| 4,914,046 | 4/1990 | Tobin . |
| 4,950,617 | 8/1990 | Kumagai et al. ............... 437/41 |
| 4,962,054 | 10/1990 | Shikata . |
| 5,015,598 | 5/1991 | Verhaar . |
| 5,036,017 | 7/1991 | Noda ............................ 437/41 |
| 5,066,604 | 11/1991 | Chung et al. . |
| 5,200,358 | 4/1993 | Bollinger et al. . |
| 5,286,664 | 2/1994 | Horiuchi . |
| 5,296,398 | 3/1994 | Noda . |
| 5,393,676 | 2/1995 | Anjum et al. . |
| 5,397,715 | 3/1995 | Miller . |
| 5,427,963 | 6/1995 | Richart et al. .................. 437/41 |
| 5,525,552 | 6/1996 | Huang . |
| 5,532,176 | 7/1996 | Katada et al. . |
| 5,547,885 | 8/1996 | Ogoh . |
| 5,656,518 | 8/1997 | Gardner et al. . |
| 5,679,592 | 10/1997 | Kang . |
| 5,744,371 | 4/1998 | Kadosh et al. . |
| 5,783,458 | 7/1998 | Kadosh et al. . |
| 5,828,104 | 10/1998 | Mizushima ..................... 257/344 |

FOREIGN PATENT DOCUMENTS

| | | |
|---|---|---|
| 575099 | 12/1993 | European Pat. Off. . |
| 3939319 | 5/1990 | Germany . |
| 63-78574 | 4/1988 | Japan . |
| 403198349 | 8/1991 | Japan . |
| 07326736 | 12/1995 | Japan . |
| 7-326736 | 12/1995 | Japan . |

OTHER PUBLICATIONS

Horiuchi et al., "An Asymmetric Sidewall Process for High Performance LDD MOSFET's," IEEE Transactions on Electron Devices, vol. 41, No. 2, Feb. 1994, pp. 186–190.

Primary Examiner—Olik Chaudhuri
Assistant Examiner—Daniel H. Mao
Attorney, Agent, or Firm—Conley, Rose & Tayon; Robert C. Kowert; Kevin L. Daffer

[57] ABSTRACT

A process for fabricating a transistor in which a first impurity distribution is introduced into a semiconductor substrate prior to the formation of a conductive gate structure on the semiconductor substrate. The substrate includes a channel region disposed between a source region and an LDD region. The LDD region is laterally disposed between a channel region and a drain region. A gate dielectric layer is then formed on an upper surface of the semiconductor substrate. A conductive gate structure is then formed on an upper surface of the gate dielectric layer. A first sidewall of the conductive gate is aligned over a boundary between the source region and the channel region. A second sidewall of the conductive gate is aligned above a boundary between the channel region and the LDD region. A second impurity distribution is then implanted into the semiconductor substrate. The conductive gate structure masks the channel region during the implanting of the second impurity distribution such that the second impurity distribution is introduced into the LDD region as well as the source and drain regions of the semiconductor. An implant dose of the first implant is greater than an implant dose of the second implant such that the transistor includes a lightly doped drain region in close proximity to a drain region for reducing a maximum electric field produced within the channel region during device operation. In addition, the transistor lacks a lightly doped region in close proximity to the source region.

20 Claims, 2 Drawing Sheets

ASYMMETRICAL MOSFET WITH GATE PATTERN AFTER SOURCE/DRAIN FORMATION

BACKGROUND OF THE INVENTION

1. Field of the Invention

This invention relates to the field of semiconductor processing and more particularly to a method of fabricating asymmetric transistors by patterning the transistor gate after the formation of the source/drain region.

2. Description of the Relevant Art

Fabrication of a MOSFET device is well known. Generally speaking, MOSFETs are manufactured by depositing polysilicon over a relatively thin gate oxide. The polysilicon material is then patterned to form a gate conductor with source/drain regions adjacent to and on opposite sides of the gate conductor. The gate conductor and source/drain regions are then implanted with an impurity dopant material. If the impurity dopant material used for forming the source/drain regions is n-type, then the resulting MOSFET is an NMOSFET ("n-channel") transistor device. Conversely, if the source/drain dopant material is p-tiype, then the resulting MOSFET is a PMOSFET ("p-channel") transistor device.

The gate conductor and adjacent source/drain regions are formed using well known photolithography techniques. Gate conductors and source/drain regions are located in openings formed through a thick layer of what is commonly referred to as field oxide. Those openings and the transistors formed therein are termed active regions. Conductive interconnects are routed over the field oxide to couple with the polysilicon gate conductor as well as with the source/drain regions to complete the formation of an overall circuit structure.

Integrated circuits utilize either n-channel devices exclusively, p-channel devices exclusively, or a combination of both on a monolithic substrate. While both types of devices can be formed, the devices are distinguishable based on the source/drain impurity dopant. The method by which n-type dopant is used to form an n-channel device and p-type dopant is used to form a p-channel device entails unique problems associated with each device. As layout densities increase, the problems are exacerbated. Device failure can occur unless adjustments are made to processing parameters and processing steps. N-channel processing must, in most instances, be dissimilar from p-channel processing due to the unique problems of each type of device. Problems inherent in n-channel fabrication will be discussed first followed by p-channel second.

N-channel devices are particularly sensitive to so-called short-channel effects ("SCE"). The distance between source and drain regions is often referred to as the physical channel length. However, after implantation and subsequent diffusion of the source and drains, distance between the source and drains regions become less than the physical channel length and is often referred to as the effective channel length ("Leff"). In VLSI designs, as the physical channel becomes small, so too must the Leff. SCE becomes a predominant problem whenever Leff drops below approximately 2.0 $\mu$m.

Generally speaking, SCE impacts device operation by, inter alia, reducing device threshold voltages and increasing sub-threshold currents. As Leff becomes quite small, the depletion regions associated with the source and drain areas may extend toward one another and substantially occupy the channel area. Hence, some of the channel will be partially depleted without any influence of gate voltage. As a result, less gate charge is required to invert the channel of a transistor having a short Leff. Somewhat related to threshold voltage lowering is the concept of sub-threshold current flow. Even at times when the gate voltage is below the threshold amount, current between the source and drain nonetheless exist for transistors having a relatively short Leff.

Two of the primary causes of increased sub-threshold current are: (i) punch through and (ii) drain-induced barrier lowering ("DIBL"). Punch through results from the widening of the drain depletion region when a reverse-bias voltage is applied across the drain-well junction. The electric field of the drain may eventually penetrate to the source area, thereby reducing the potential energy barrier of the source-to-body junction. Punch through current is therefore associated within the substrate bulk material, well below the substrate surface. Contrary to punch through current, DIBL-induced current occurs mostly at the substrate surface. Application of a drain voltage can cause the surface potential to be lowered, resulting in a lowered potential energy barrier at the surface and causing the sub-threshold current in the channel near the silicon-silicon dioxide interface to be increased. One method in which to control SCE is to increase the dopant concentration within the body of the device. Unfortunately, increasing dopant within the body deleteriously increases potential gradients in the resulting device.

Increasing the potential gradients produces an additional effect known as hot-carrier effect ("HCI"). HCI is a phenomena by which the kinetic energy of the carriers (holes or electrons) is increased as they are accelerated through large potential gradients and subsequently become trapped within the gate oxide. The greatest potential gradient, often referred to as the maximum electric field ("Em") occurs near the drain during saturated operation. More specifically, the electric field is predominant at the lateral junction of the drain adjacent the channel.

Using the n-channel example, the electric field at the drain causes channel electrons to gain kinetic energy. Electron-electron scattering randomizes the kinetic energy and the electrons become "hot". Some of these hot electrons have enough energy to create electron-hole pairs through impact ionization of the silicon atoms. Electrons generated by impact ionization join the flow of channel electrons, while the holes flow into the bulk to produce a substrate current in the device. The substrate current is the first indication of the creation of hot carriers in a device. For p-channel devices, the fundamentals of the process are essentially the same except that the role of holes and electrons are reversed.

HCI occurs when some of the hot carriers are injected into the gate oxide near the drain junction, where they induce damage and become trapped. Traps within the gate oxide generally become electron traps, even if they are initially filled with holes. As a result, there is a negative charge density in the gate oxide. The trapped charge accumulates with time, resulting in positive threshold shifts in both n-channel and p-channel devices. It is know that since hot electrons are more mobile than hot holes. HCI causes a greater threshold skew in n-channel devices than p-channel devices.

Unless modifications are made to the transistor structure, problems of sub-threshold current and threshold shift resulting from SCE and HCI will remain. To overcome these problems, alternative drain structures such as double-diffused drains (DDDs) and lightly doped drains (LDDs) must be used. The purpose of both types of structures is the same: to absorb some of the potential into the drain and thus reduce Em. The popularity of DDD structures has given way to LDD structures since DDD causes unacceptably deep junctions and deleterious junction capacitance.

A conventional LDD structure is one whereby a light concentration of dopant is self-aligned to the gate electrode followed by a heavier dopant self-aligned to the gate electrode on which two sidewall spacers have been formed. The purpose of the first implant dose is to produce a lightly doped section of both the source and drain areas at the gate edge near the channel. The second implant dose is spaced from the channel a distance dictated by the thickness of the sidewall spacer and results in a dopant gradient occurs at the junction between the source and channel as well as the junction between the drain and channel.

A properly defined LDD structure must be one which minimizes HCI but not at the expense of excessive source/drain resistance. The addition of an LDD implant adjacent the channel unfortunately adds resistance to the source/drain path. This added resistance, generally known as parasitic resistance, has deleterious effects including. First, parasitic resistance can decrease the saturation current (i.e., current above threshold). Second, parasitic resistance can decrease the overall speed of the transistor.

The deleterious effects of decreasing saturation current and transistor speed is best explained in reference to a transistor having a source resistance and a drain resistance. The source and drain parasitic resistances are compounded by the presence of the conventional source and drain LDDs. Using a n-channel example, the drain resistance $R_D$ causes the gate edge near the drain to "see" a voltage less than VDD, to which the drain is typically connected. Similarly, the source resistance $R_S$ causes the gate edge near the source to see some voltage more than ground. As far as the transistor is concerned, its drive current along the source-drain path depends mostly on the voltage applied between the gate and source, i.e., $V_{GS}$. If $V_{GS}$ exceeds the threshold amount, the transistor will go into saturation according to the following relation:

$$I_{DSAT}=K/2*(V_{GS}-V_T)^2$$

where $I_{DSAT}$ is saturation current, K is a value derived as a function of the process parameters used in producing the transistor, and $V_T$ is the threshold voltage. Reducing or eliminating $R_S$ would therefore draw the source voltage closer to ground, and thereby increasing the effective $V_{GS}$. From the above equation, it can be seen that increasing $V_{GS}$ directly increases $I_{DSAT}$. While it would seem beneficial to decrease $R_D$ as well, $R_D$ is nonetheless needed to maintain HCI control. Accordingly, substantial LDD is required in the drain area. It would therefore seem beneficial to decrease $R_S$ rather than $R_D$. This implies the need for a process for decreasing $R_S$ (source-side LDD area) while maintaining $R_D$ (drain-side LDD area).

Proper LDD design must take into account the need for minimizing parasitic resistance $R_S$ at the source side while at the same time attenuating Em at the drain-side of the channel. Further, proper LDD design requires that the injection position associated with the maximum electric field Em be located under the gate conductor edge, preferably well below the silicon surface. It is therefore desirable to derive an LDD design which can achieve the aforesaid benefits while still properly placing and diffusing Em. This mandates that the channel-side lateral edge of the LDD area be well below the edge of the gate. Regardless of the LDD structure chosen, the ensuing transistor must be one which is not prone to excessive sub-threshold currents, even when the Leff is less than, e.g., 0.5 μm.

A properly designed LDD-embodied transistor which overcomes the above problems must therefore be applicable to either an n-channel transistor or a p-channel transistor. That transistor must be one which is readily fabricated within existing process technologies. In accordance with many modern fabrication techniques, it would be desirable that the improved transistor be formed having a net impurity concentration within the polysilicon gate of the same type as the LDD implant area and/or source/drain area.

SUMMARY OF THE INVENTION

The problems outlined above are in large part addressed by a semiconductor process in which portions of the source and drain structures of the transistors are formed after the formation of the polysilicon gate structure. By fabricating portions of the source and drain structures before the formation of the gate structure, the present invention contemplates a practical method of producing a lightly doped drain structure on the drain side of the transistor to reduce the maximum electric field in the channel region proximal to the drain structure while simultaneously minimizing the parasitic resistance of the source structure.

Broadly speaking the present invention contemplates a process for fabricating a transistor in which a first impurity distribution is introduced into a semiconductor substrate prior to the formation of a conductive gate structure on the semiconductor substrate. The substrate includes a channel region disposed between a source region and an LDD region. The LDD region is laterally disposed between the channel region and a drain region. A gate dielectric layer is then formed on an upper surface of the semiconductor substrate. A conductive gate structure is then formed on an upper surface of the gate dielectric layer. A first sidewall of the conductive gate structure is aligned over a boundary between the source region and the channel region. A second sidewall of the conductive gate is aligned above a boundary between the channel region and the LDD region. In this manner, the second sidewall is laterally displaced from the drain region by a lateral dimension of the LDD region. A second impurity distribution is then implanted into the semiconductor substrate. The conductive gate structure masks the channel region during the implanting of the second impurity distribution such that the second impurity distribution is introduced into the LDD region as well as the source and drain regions of the semiconductor. An implant dose of the first implant is greater than an implant dose of the second implant such that the transistor includes a lightly doped drain region in close proximity to a drain region for reducing a maximum electric field produced within the channel region during device operation. In addition, the transistor lacks a lightly doped region in close proximity to the source region. The absence of a lightly doped region adjacent to the source region reduces the parasitic capacitance of the source region beneficially improving the saturated drain current of the transistor for improved device performance.

In a presently preferred embodiment, the process further includes implanting a threshold adjust impurity distribution into the semiconductor substrate. In one embodiment, the threshold adjust implant is performed prior to the formation of the gate dielectric. In another embodiment, the threshold adjust implant is performed after the gate dielectric formation. The first impurity distribution is preferably introduced into the semiconductor substrate with an ion implantation process using arsenic, boron, phosphorous, or other well known impurity distributions. In the preferred embodiment, the implant dose of the first implant is in excess of approximately $2\times10^{15}$ atoms/cm$^2$. The second implant is typically accomplished using an arsenic boron or phosphorous implant with an implant dose of less than approximately $2\times10^{15}$ atoms/cm$^2$. In this manner, the presence of the second impurity distribution within the source region and the drain region does not significantly alter the electrical characteristics of the source and drain regions.

The preferred method of forming the gate dielectric comprises thermally oxidizing the semiconductor substrate in an oxygen bearing ambient maintained at a temperature in the range of approximately 500 to 800° C. The formation of the conductive gate structure in a presently preferred embodiment is accomplished by depositing a polysilicon layer on the gate dielectric, forming a patterned photoresist layer on the polysilicon layer, and etching portions of the polysilicon layer exposed by the patterned photoresist layer. The deposition of the polysilicon layer is suitably achieved by thermally decomposing silane in a chemical vapor deposition reactor chamber maintained at a temperature in the range of approximately 580 to 650° C. The polysilicon layer is preferably etched by patterning the photoresist layer with a fluorine bearing plasma. In one embodiment, the process further comprises forming spacer structures on sidewalls of the conductive gate after introducing the second impurity distribution into the semiconductor substrate.

The present invention still further contemplates a process for forming a transistor in which a semiconductor substrate is provided and a first masking layer formed on the semiconductor substrate. A first impurity distribution is implanted into the semiconductor substrate prior to forming a conductive gate structure. The first masking layer masks the implant such that the first impurity distribution is aligned to the first masking layer within the semiconductor substrate. The first masking layer is then removed from the surface and a gate dielectric formed on an upper surface of the substrate. A conductive gate structure is then formed on an upper surface of the gate dielectric layer. A first sidewall of the conductive gate is aligned over a first boundary of the first impurity distribution. A second sidewall of the conductive gate is aligned over a second boundary of the first impurity distribution. A second impurity distribution is then implanted into the semiconductor substrate. The conductive gate structure masks the implantation of the second impurity distribution such that the second impurity distribution is aligned to the conductive gate structure. In this manner, the second impurity distribution is laterally displaced with respect to the first impurity distribution on a first side of the transistor. The second impurity distribution is substantially aligned with the first impurity distribution on a second side of the transistor.

In the preferred embodiment, the formation of the first masking layer is accomplished by depositing a photoresist layer on the semiconductor substrate and photolithographically patterning the photoresist layer. In one embodiment, the first implant dose is substantially greater than the second implant dose. In this embodiment, a lateral dimension of the conductive gate structure is less than a displacement between the first and second boundaries. In one embodiment, the process further includes implanting a threshold adjust impurity distribution into the semiconductor substrate. In alternative embodiments, the threshold adjust implant may be formed prior the formation of the gate dielectric or after the formation of the gate dielectric. In one embodiment, process further includes the formation of spacer structures on the sidewalls of the conductive gate structures.

The present invention still further contemplates a semiconductor process for forming a first and a second transistor of an integrated circuit. A semiconductor substrate is provided. The semiconductor substrate includes a first channel region as located between a first source region and a first LDD region. The first LDD region is located between the first channel region and a first drain region. The substrate further includes a second channel region isolated from the first channel region by an isolation structure located between the first and second channel regions. The second channel region is located between a pair of second source/drain regions. A first impurity distribution is introduced into the first source region, the first drain region, and the pair of second source/drain regions of the substrate prior to forming conductive gate structures. A gate dielectric is then grown on an upper surface of the substrate and first and second conductive gate structures are formed on an upper surface of the gate dielectric. A first sidewall of the first conductive gate is aligned over a boundary between the first source region and the first channel region. A second sidewall of the first conductive gate is aligned above a boundary between the first channel region and the first LDD region. In this fashion, the second sidewall of the first conductive gate is displaced in a lateral direction from the first drain region by approximately a lateral dimension of the first LDD region. A second impurity distribution is then implanted into the semiconductor substrate. During this implant, the first and second conductive gate structures act as an implant mask such that the second impurity distribution is self aligned to the first and second conductive gates respectively. A peak concentration of the first impurity distribution is greater than a peak concentration of the second impurity distribution so that the presence of the second impurity distribution within the first source region and the first drain region does not significantly alter the electrical characteristics of these regions. Sidewall spacer structures are then formed on the first and second conductive gates. The processing described results in a first transistor comprising the first conductive gate structure, the first source region, the first LDD region, and the first drain region. Accordingly, the first transistor includes a lightly doped drain that is proximally located to the first drain region to reduce the maximum electrical field within the first channel region. The first transistor also lacks a lightly doped region proximal to the first source region to reduce parasitic resistance associated with the source region. In contrast, the second transistor includes the second conductive gate structure and the pair of second source/drain regions whereby the second transistor includes lightly doped regions proximal to its pair of source/drain regions. Thus, this embodiment includes asymmetric transistors in which the drain is bounded by a lightly doped regino and symmetrical transistors, in which both source/drain structures are bounded by lightly doped regions.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

Figure 1:
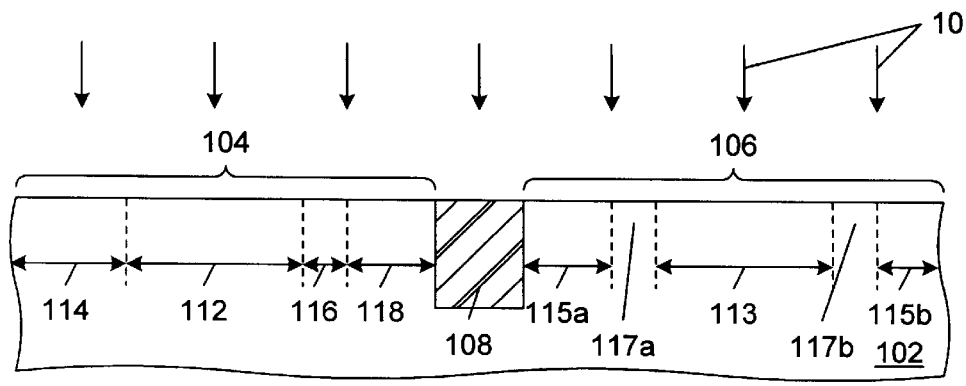
FIG. 1 is a partial cross-sectional view of a semiconductor substrate including a first region and a second region isolated by an isolation structure located between the two regions.

Turning now the drawings, FIGS. 1 through 6 show a processing sequence for one embodiment of the present invention. In this embodiment, a first transistor 180 and second transistor 182 (shown in FIG. 6) are fabricated on a semiconductor substrate 102. First transistor 180 and second transistor 182 are isolated from each other by an isolation structure 108 displaced between the transistors. First transistor 180 includes a lightly doped drain (LDD) impurity distribution 152 proximal to a first channel region 112 but does not contain a symmetric lightly doped region aproximal to a source impurity distribution 126a. This asymmetry in first transistor 180 is designed to simultaneously reduce the maximum electric field within first channel 112 when a drain terminal is biased by distributing the potential gradient partially across lightly doped impurity distribution 152 while minimizing a series or parasitic resistance associated with a source impurity distribution 126a. This arrangement is beneficial in transistors in the transistor terminals are dedicated and wherein the dedicated source terminal is continuously grounded. Second transistor 182, on the other hand, includes a more conventional symmetric implementation in which both source/drain impurity distributions 126c and 126d are fabricated proximal to respective lightly doped impurity distributions 152b and 152c. This symmetric arrangement is advantageous in transistors, such as the pass transistors in a conventional memory array, designed to operate bi-directionally. Thus, the embodiment depicted in FIGS. 1 through 6 include a process for forming first transistor 180 and second transistor 182. Another embodiment of the present invention is dedicated to the process for forming the first transistor 180. Although this embodiment of the present invention is not depicted in separate drawings, it will be appreciated that the processing sequence used to fabricate first transistor 180 and second transistor 182 simultaneously can be used to fabricate a plurality of transistors such as first transistor 180. This embodiment may be advantageous in a design in which none or substantially none of the transistors are designed to operate bi-directionally.

Turning now to FIG. 1, the process begins by providing semiconductor substrate 102. Semiconductor substrate 102 includes the first channel region 112 that is laterally disposed between a first source region 114 and a first LDD region 116. The first LDD region 116 is located between first channel region 112 and first drain region 118. In an embodiment of the present invention designed for fabricating both asymmetric first transistor 180 and symmetric second transistor 182, semiconductor substrate 102 further includes a second active region 106 laterally displaced and isolated from the first region 104 by an isolation structure 108. Isolation structure 108 preferably comprises an isolation dielectric such as a CVD oxide deposited into a trench formed in semiconductor substrate 102 and thereafter planarized with a planarization process such as a chemical mechanical polish. Alternatively, isolation structure 108 may comprise a LOCOS structure as is well known in the field. Second active region 106 includes a second channel region 113 situated between a pair of second lightly doped regions 117a and 117b. The pair of lightly doped regions 117a and 117b are situated between the pair of second source/drain regions 115a and 115b as shown in FIG. 1 FIG. 1 further indicates with reference numeral 110, the introduction of an impurity distribution. It is contemplated that, in one embodiment, a threshold adjust impurity distribution may be introduced into semiconductor substrate 102 prior to the formation of a gate dielectric as described below to potentially improve the quality of the gate dielectric by minimizing the number of high energy implants to which the gate dielectric is subjected. At this time a punch-through and a well implant may be performed. A threshold adjust impurity distribution is suitably introduced into semiconductor substrate 102 with an ion implantation process in which a relatively light dose (i.e., a dose less than approximately $2 \times 10^{14}$ atoms/cm$^2$) of a boron species is implanted into semiconductor substrate 102. As its name implies, a threshold adjust impurity process is designed to alter the threshold voltage of the affected transistor region by introducing an impurity distribution of an appropriate type into semiconductor substrate 102.

Figure 2:
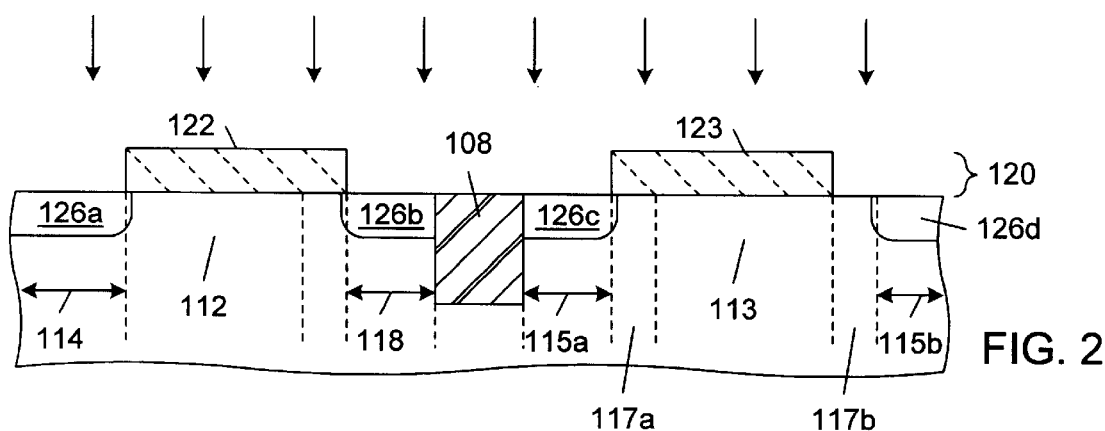
FIG. 2 is a processing step subsequent to FIG. 1 in which a first masking layer has been formed on the substrate and a first impurity distribution selectively introduced into the substrate.

Turning now to FIG. 2, a first masking layer 120 is formed on an upper surface 101 of semiconductor substrate 102. The first masking layer 120 includes a first masking structure 122 that is aligned over channel region 112 and lightly doped drain region 116 of semiconductor substrate 102. In one embodiment, first masking layer 120 comprises a patterned photoresist layer preferably formed by spin depositing a photoresist layer across the entire upper surface 101 of semiconductor substrate 102 and thereafter selectively polymerizing portions of the photoresist by directing an optical energy source such as a mercury vapor lamp at the photoresist layer through a photomask as is well known in the field of photolithography. In an embodiment of the present invention directed towards the fabrication of asymmetric first transistor 180 and symmetric second transistor 182, first masking layer further includes a second masking structure 123 aligned over second channel region 113.

Returning to FIG. 2, a first impurity distribution 126 is introduced into semiconductor substrate 102 in the presence of first masking layer 120 such that the first impurity distribution 126 is self aligned under first masking structure 122. In the embodiment shown in FIG. 2, first impurity distribution 126 is substantially prevented from entering first channel region 112 and first LDD region 116. In a presently preferred embodiment, a suitable dose used for implant process 124 shown in FIG. 2 is in excess of approximately $2 \times 10^{15}$ atoms/cm$^2$. Appropriate implant energies for first implant 124 as shown in FIG. 2 is suitably in the range of approximately 5 to 100 keV . It should be noteworthy to those skilled in the art of semiconductor fabrication that the introduction of a source/drain impurity distribution into the semiconductor substrate prior to the formation of a conductive gate structure has generally been undesirable since the first introduction of a self aligned polysilicon gate MOS transistor process. In the present invention, however, a pre-gate implant is advantageously implemented to facilitate the fabrication of an asymmetric transistor such as first transistor 180 to achieve the benefits of LDD structures on the drain side of the transistor without incurring the resulting decrease in transistor performance due to the undesirable and largely unnecessary series parasitic resistance associated with lightly doped regions proximal to the source terminal of a typical MOS transistor. In the embodiment of the present invention directed towards the fabrication of asymmetric and symmetric transistors, first impurity distribution 126 is also introduced into the pair of second source/drain regions 115a and 115b.

Figure 3:
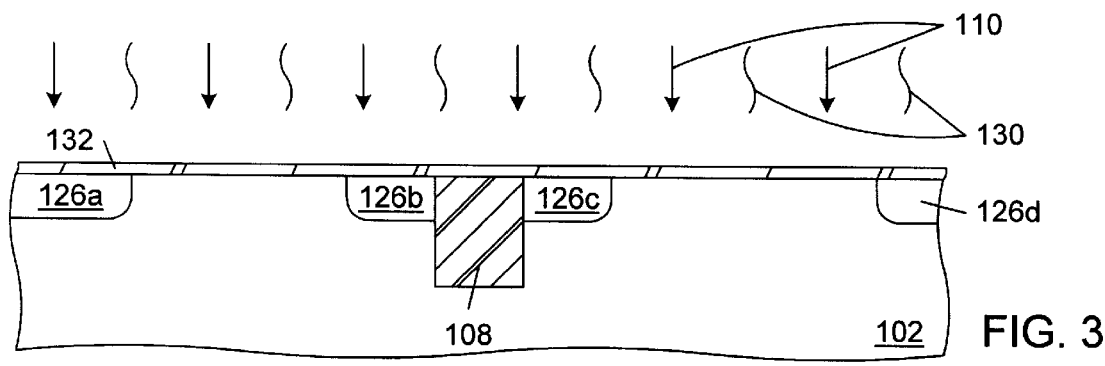
FIG. 3 is a processing step subsequent to FIG. 4 in which a gate dielectric is formed on an upper surface of the semiconductor substrate.

Turning now to FIG. 3, a gate dielectric layer 132 is fabricated on upper surface 101 of semiconductor substrate 102. In the preferred embodiment, the formation of gate dielectric 132 is accomplished with a thermal oxidation process represented in FIG. 3 by reference numeral 130. Thermal oxidation suitably includes exposing semiconductor substrate 102 to an oxygen bearing ambient maintained at a temperature in the range of approximately 500 to 800° C. preferably within a thermal oxidation tube or a rapid thermal apparatus chamber to grow a film with thickness in the range of approximately 15 to 100 angstroms. It will be further noted that FIG. 3 discloses ion implantation 110 which represents the introduction of a threshold adjust impurity distribution into semiconductor substrate 102 as described with respect to FIG. 1. It is contemplated in the present invention that a threshold adjust implant may be performed after the formation of gate dielectric 132. Post gate oxidation threshold adjust may be desirable in applications in which it is preferred to minimize the high temperature processing to which the threshold adjust impurity distribution is subjected. Because the thermal oxidation process preferred for the formation of gate dielectric 132 may be accomplished at temperatures in the range of 800° C., the redistribution of the threshold adjust impurity implant may be substantially minimized by performing the implant 110 after the formation of gate dielectric 132. It will be appreciated to those skilled in the art that although the figures depict ion implantation 110 in FIG. 1 and in FIG. 3, only one threshold adjust impurity distribution is contemplated.

Figure 4:
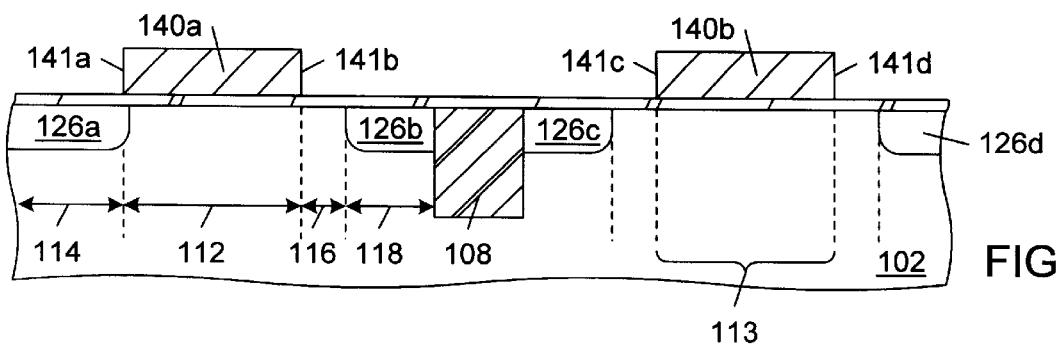
FIG. 4 is a processing step subsequent to FIG. 4 in which first and second conductive gate structures have been formed on the gate dielectric.

Turning now to FIG. 4, a first conductive gate structure 140a is formed above first channel region 112 of semiconductor substrate 102. First conductive gate structure 140 includes a first sidewall 141a and a second sidewall 141b. First sidewall 141a is aligned above a boundary between first source region 114 and first channel region 112. Accordingly, first sidewall 141a is substantially aligned above a boundary of first impurity distribution 126a. Second sidewall 141b of first conductive gate structure 140a is aligned above a boundary between first LDD region 116 and first channel region 112. Accordingly, second sidewall 141b of first conductive gate structure 141a is displaced from a boundary between LDD region 116 and first drain region 118 by a lateral dimension $W_{LDD}$. In an embodiment of the present invention, including symmetrical source/drain regions, a second conductive gate structure 140b is fabricated over second channel region 113 of substrate 102. The sidewalls 141c and 141d of second conductive gate 140b are aligned above boundaries between second channel region 113 and respective lightly doped regions 117a and 117b. It will be appreciated to those skilled in the art that the displacement of second sidewall 141b from first drain region 118 and the alignment of first sidewall 141a over first source region 114 facilitate a fabrication of an asymmetric transistor while the symmetrical displacement of the sidewalls 141c and 141d of second conductive gate structure 140b are consistently the fabrication of a bi-directional symmetrical transistor including a pair of source/drain regions.

Figure 5:
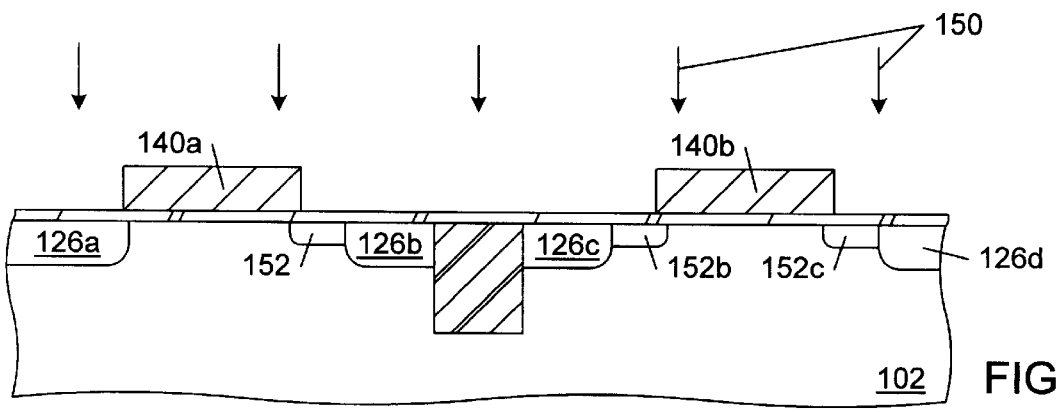
FIG. 5 is a processing step subsequent to FIG. 5 in which a second impurity distribution is introduced into the semiconductor substrate using the conductive gate structures as an implant mask.

Turning now to FIG. 5 a lightly doped impurity distribution 152 is introduced into semiconductor substrate 102, preferably through the use of ion implantation process 150. The presence of first conductive gate structure 140a during ion implantation 150 masks lightly doped impurity distribution 152 and substantially prevents distribution 152 from entering first channel region 112. In the preferred embodiment, an implant dose, implant energy, and peak concentration of lightly doped impurity distribution 152 are less than the respective implant dose, implant energy, and peak concentration used to fabricate first impurity distribution 126. Thus, the presence of lightly doped impurity distribution 152 within first source region 114 and first drain region 118 does not significantly alter the electrical characteristics of these regions due to the presence of the heavier impurity distribution 126. In the presently preferred embodiment, an implant suitable for lightly doped impurity distribution 152 is in the range of approximately $1 \times 10^{14}$ to $2 \times 10^{15}$ atoms/cm$^2$ while a suitable implant energy is in the range of approximately 10 to 50 keV. In an embodiment of the present invention including symmetrical transistors, the lightly doped impurity distribution 152 is further introduced into the pair of lightly doped source/drain regions 117a and 117b. It will be appreciated to those skilled in the art that the introduction of lightly doped impurity distribution 152 after the formation of gate structures 140a and, in an appropriate embodiment, second conductive gate structure 140b results in a lightly doped impurity distribution 152 that is self aligned to the sidewalls 141 of the conductive gate structure 140. The self alignment of the lightly doped regions to the conductive gate structures beneficially eliminates this alignment between the gate structures 140 and the lightly doped impurity distribution 152 that can result in increased parasitic resistance and reduced transistor drive current or, alternatively, excessive overlap between the gate structures and the lightly doped impurity distributions resulting in a reduction or elimination in the benefits derived by implementing a lightly doped region.

Figure 6:
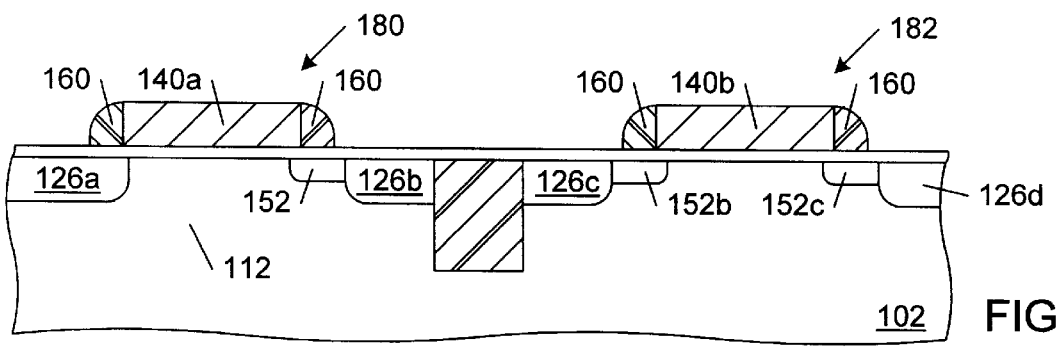
FIG. 6 is a processing step subsequent to FIG. 5 in which spacer structures have been formed on sidewalls of the first and second conductive gate structures; and While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

Turning now to FIG. 6, dielectric spacer structures 160 are fabricated on respective sidewalls 141 of respective gate structures 140. Fabrication of spacer structures 160 is accomplished, in a presently preferred embodiment by depositing an oxide such as a chemically vapor deposited TEOS layer over the topography of the wafer and thereafter performing an anisotropic plasma etch process until portions of the dielectric layer that are substantially parallel to the upper surface of semiconductor substrate 102 have been removed from the wafer surface. The fabrication of spacer structures, although typically required prior to the formation of the heavily doped source/drain regions of the semiconductor substrate, is implemented in a preferred embodiment of the present invention to facilitate silicide formation. In a silicide formation process, a refractory metal (i.e., a metal having a melting point in excess of approximately 900° C.) is deposited over the wafer. Where the refractory metal contacts silicon, such as in the source/drain regions or in the polysilicon gate structure, a subsequent heat treatment will react the refractory metal with the silicon to produce a silicide having a sheet resistivity significantly less than a sheet resistivity of the doped silicon. The presence of the dielectric spacer structures upon the wafer upper surface prevents silicide shorts from source or drain to the gate of the transistor by providing an intermediate region upon which the refractory metal does not react during the heat treatment. The unreacted refractory metal can be removed with an etch process after the heat treatment process. In another embodiment, the silicide formation process may be accomplished with two heat cycles. After the first heat cycle, the unreacted refractory metal is removed from the wafer upper surface. During a second and higher temperature heat cycle, the resistivity of the silicide is reduced by further alloying the silicide.

It will be appreciated to those skilled in the art that the present invention contemplates the fabrication of an asymmetrical transistor in which portions of the source/drain regions are fabricated after the formation of the polysilicon gate structure. In one embodiment of the invention, the process further includes the simultaneous fabrication of symmetrical and bidirectional transistors including lightly doped source/drain regions fabricated after the formation of the conductive gate structure. The fabrication of the lightly doped regions after the fabrication of the conductive gate structure beneficially facilitates the formation of asymmetrical transistors desirable or dedicated transistors in which source regions remains essentially grounded during normal circuit operation. Various modifications and changes may be made without departing from the spirit and scope of the invention as set forth in the claims. It is intended that the following claims be interpreted to embrace all such modifications and changes.

What is claimed is:

1. A semiconductor process for fabricating a transistor, comprising:
   providing a semiconductor substrate, wherein said semiconductor substrate includes a channel region laterally disposed between a source region and an LDD region, and further wherein said LDD region is laterally disposed between said channel region and a drain region;
   introducing a first impurity distribution into said source region and said drain region of said semiconductor substrate prior to forming a conductive gate structure;
   forming a gate dielectric layer on an upper surface of said semiconductor substrate;
   forming a conductive gate structure on an upper surface of said gate dielectric layer wherein a first sidewall of said conductive gate structure is laterally aligned above a boundary between said source region and said channel region and further wherein a second sidewall of said conductive gate structure is laterally aligned above a boundary between said channel region and said LDD region, whereby said second sidewall of said conductive gate structure is laterally displaced from said drain region by a lateral dimension of said LDD region; and
   implanting a second impurity distribution into said semiconductor substrate, wherein said conductive gate structure masks said channel region during said implanting whereby said second impurity distribution is introduced into said LDD region as well as said source and drain regions of said semiconductor and further wherein an implant dose of said first implant is greater than an implant dose of said second whereby the transistor includes an LDD region proximal to said drain region for reducing a maximum electrical field proximal to said drain region and whereby the transistor lacks a lightly doped region proximal to said source region to reduce a parasitic resistance of said source region.

2. The process of claim 1, further comprising implanting a threshold adjust impurity distribution into said semiconductor substrate.

3. The process of claim 2, wherein said threshold adjust implant is performed prior to the forming of said gate dielectric.

4. The process of claim 2, wherein said threshold adjust implant is performed after the forming of said gate dielectric.

5. The process of claim 1, wherein said semiconductor substrate comprises a single crystal silicon wafer comprising a p-type epitaxial layer formed over a p+ silicon bulk, and further wherein a resistivity of said p-type epitaxial layer is in the range of approximately 10 to 15 $\Omega$-cm.

6. The process of claim 1, wherein the step of introducing said first impurity distribution comprises implanting a species selected from the group consisting of arsenic, boron, and phosphorous using an implant dose in excess of approximately $1\times10^{15}$ atoms/cm$^2$ and further wherein the step of introducing said second impurity distribution comprises implanting a species selected from the group consisting of arsenic, boron, and phosphorous using an implant dose less than approximately $2\times10^{14}$ atoms/cm$^2$ whereby the presence of said second impurity distribution within said source region and said drain region of said semiconductor substrate does not significantly alter the electrical characteristics of said source or drain regions.

7. The process of claim 1, wherein the step of forming said gate dielectric comprises thermally oxidizing said upper surface of said semiconductor substrate by immersing said semiconductor substrate in an oxygen bearing ambient maintained at a temperature in the range of approximately 500 to 800° C.

8. The process of claim 1, wherein the step of forming said conductive gate structure comprises:
   depositing a polysilicon layer on said gate dielectric by thermally decomposing silane in a chemical vapor deposition reactor chamber maintained at a temperature in the range of approximately 580 to 650° C.;
   forming a patterned photoresist layer said polysilicon layer; and
   etching portions of said polysilicon layer exposed by said patterned photoresist layer with a fluorine bearing plasma.

9. The process of claim 1, further comprising forming spacer structures on sidewalls of said conductive gate structure after the introducing of said second impurity distribution.

10. A process for forming a transistor, comprising:
    providing a semiconductor substrate;
    forming a first masking layer on said semiconductor substrate, wherein said first masking layer masks portions of an upper surface;
    implanting a first impurity distribution into said semiconductor substrate prior to forming a conductive gate structure, wherein first masking layer masks said implant whereby said first impurity distribution is aligned to said first masking layer within said semiconductor substrate;
    removing said first masking layer from said semiconductor substrate;
    forming a gate dielectric layer on an upper surface of said semiconductor substrate;
    forming a conductive gate structure on an upper surface of said gate dielectric layer wherein a first sidewall of said conductive gate structure is laterally aligned above a first boundary of said first impurity distribution and wherein a second sidewall of said conductive gate structure is laterally displaced from a second boundary of said first impurity distribution; and implanting a second impurity distribution into said semiconductor substrate, wherein said conductive gate structure masks said implanting whereby said second impurity distribution is aligned to said conductive gate structure such that said second impurity distribution is laterally displaced with respect to said first impurity distribution on a first side of said transistor and further wherein said second impurity distribution is substantially aligned with said first impurity distribution on a first side of said transistor.

11. The process of claim 10, wherein the step of forming said first masking layer comprises:

depositing a photoresist layer on said semiconductor substrate; and photolithographically patterning said photoresist layer.

12. The process of claim 10, wherein an implant dose used for the implanting of said first impurity distribution is substantially greater than an implant dose used for the implanting of said second impurity distribution.

13. The process of claim 12, wherein said a lateral dimension of said conductive gate structure is less than a displacement between said first boundary and said second boundary.

14. The process of claim 10, further comprising implanting an threshold adjust impurity distribution into said semiconductor substrate.

15. The process of claim 14, wherein said threshold adjust implant is performed prior to the forming of said gate dielectric layer.

16. The process of claim 14, wherein said threshold adjust implant is performed after the forming of said gate dielectric layer.

17. The process of claim 10, further comprising forming spacer structures on sidewalls of said conductive gate structure.

18. A semiconductor process for forming first and second transistors, comprising:

providing a semiconductor substrate, wherein said semiconductor substrate includes a first channel region laterally disposed between a first source region and a first LDD region, and further wherein said first LDD region is laterally disposed between said first channel region and a first drain region, and further wherein said semiconductor substrate includes a second channel region isolated from said first channel region by an isolation structure intermediate between said first and second channel regions, and further wherein said second channel region is laterally disposed between a pair of second lightly doped regions wherein said pair of lightly doped regions are displaced between a second pair of source/drain regions;

introducing a first impurity distribution selectively into said first source region, said first drain region, and a second pair of second source/drain regions of said semiconductor substrate prior to forming first and second conductive gate structures;

forming a gate dielectric layer on an upper surface of said semiconductor substrate;

forming first and second conductive gate structures on an upper surface of said gate dielectric layer wherein a first sidewall of said first conductive gate structure is laterally aligned above a boundary between said first source region and said first channel region and further wherein a second sidewall of said first conductive gate structure is laterally aligned above a boundary between said first channel region and said first LDD region and further wherein sidewalls of said second conductive gate structure are aligned above boundaries between said second channel regions and said second pair of lightly doped regions, whereby said second sidewall of said first conductive gate structure is laterally displaced from said first drain region by a lateral dimension of said first LDD region;

implanting a second impurity distribution into said semiconductor substrate, wherein said first and second conductive gate structures serve as an implant mask during whereby said second impurity distribution is aligned to said first and second conductive gates respectively, and further wherein a peak concentration of said first impurity distribution is greater than a peak concentration of said second impurity concentration whereby the presence of said second impurity distribution within said first source region and said drain region of said semiconductor substrate does not significantly alter the electrical characteristics of said source or drain regions;

forming sidewall spacer structures on said first and second conductive gate structures; and wherein said first transistor comprises said first conductive gate structure, said first source region, said first LDD region, and said first drain region whereby said first transistor includes a lightly doped drain proximal to said first drain region to reduce a maximum electric field within said first channel region, and further wherein said first transistor lacks a lightly doped region proximately to said first source region thereby reducing a parasitic resistance of said source region, and further wherein said second transistor includes said second conductive gate structure and said pair of second source/drain regions and wherein said second transistor lightly doped regions proximal to its pair of source/drain region for bidirectional operation of said second transistor.

19. The process of claim 18, wherein the step of introducing said first impurity distribution comprises:

forming a first masking layer on said semiconductor substrate; wherein said first masking layer exposes said first source region and said first drain region and said pair of second source/drain regions; and implanting said first impurity distribution into said semiconductor substrate.

20. The process of claim 18, wherein the step of forming said first masking layer comprises:

depositing a photoresist layer on said semiconductor substrate; and photolithographically patterning said photoresist layer.

* * * * *

UNITED STATES PATENT AND TRADEMARK OFFICE
CERTIFICATE OF CORRECTION

PATENT NO. : 5,963,809

DATED : October 5, 1999

INVENTOR(S) :
Michael Duane and Mark I. Garnder

It is certified that error appears in the above-identified patent and that said Letters Patent is hereby corrected as shown below:

Col. 1, line 55, please delete "drains", and insert --drain-- in place thereof.

Col. 2, lines 28 and 29, please delete "phenomena", and insert --phenomenon-- in place thereof.

Col. 7, line 42, preceding "the transistor", please delete "in" and insert --wherein-- in place thereof.

UNITED STATES PATENT AND TRADEMARK OFFICE
CERTIFICATE OF CORRECTION

PATENT NO. : 5,963,809
DATED : October 5, 1999
INVENTOR(S) : Michael Duane and Mark I. Garnder It is certified that error appears in the above-identified patent and that said Letters Patent is hereby corrected as shown below:

Claim 10, col. 13, line 6, please delete "laterally displaced with respect to", and insert -- substantially aligned with-- in place thereof.

Claim 10, col. 13, lines 8 and 9, please delete "substantially aligned with", and insert --laterally displaced with respect to -- in place thereof.

Claim 10, col. 13, line 10, please delete "first", and insert --second-- in place thereof.

Claim 18, col. 13, line 55, preceding "source/drain regions of said", please delete "second".

Claim 18, col. 14, line 9, please delete "regions", and insert --region-- in place thereof.

Claim 18, col. 14, line 38, please delete "proximately" and insert --proximal-- in place thereof.

Claim 18, col. 14, line 41, preceding "pair of", please insert --second--.

Claim 18, col. 14, line 41, after "pair of", please delete "second".

Signed and Sealed this

Twenty-third Day of May, 2000

Attest:

Q. TODD DICKINSON

*Attesting Officer*    *Director of Patents and Trademarks*